INVENTOR
F. P. PELLETIER
BY Edward M. Fink
ATTORNEY

United States Patent Office 3,718,565

Patented Feb. 27, 1973

3,718,565

TECHNIQUE FOR THE FABRICATION OF DISCRETE RC STRUCTURE

Frank Palmer Pelletier, Wescosville, Pa., assignor to Bell Telephone Laboratories, Incorporated, Murray Hill, N.J.

Filed Nov. 27, 1970, Ser. No. 93,242

Int. Cl. C23c *15/00*

U.S. Cl. 204—192 1 Claim

ABSTRACT OF THE DISCLOSURE

A technique for the fabrication of tantalum-based resistors and capacitors on a single substrate member involves a series of process steps wherein a layer of tantalum nitride and a layer of beta-tantalum are sequentially deposited upon a substrate member and serve as the resistor and capacitor films respectively of the desired structure, the capacitor film being converted to a protective anodic oxide during the course of the processing.

BACKGROUND OF THE INVENTION

(1) Field of the invention

This invention relates to a technique for the fabrication of a discrete thin film RC circuit. More particularly, the present invention relates to a technique for the fabrication of a thin film structure comprising tantalum-based resistors and capacitors upon a single substrate.

(2) Description of the prior art

During the past decade, miniaturization of components and circuitry coupled with the increasing complexity of modern electronic systems have created an unprecedented demand for reliability in thin film components and the need for the total exploitation of the technology. This is particularly true in the case of tantalum which has long been recognized as being the most versatile of the thin film materials. In order to maximize the advantages of such versatility, it is often desirable in the fabrication of RC structures on a single substrate to employ different tantalum films, one as a resistor material and one as a capacitor material. Often, these films differ in thickness and type as, for example, beta-tantalum, low density tantalum, tantalum nitride, and so forth, so complicating the processing sequence due to the fact that the selective etching procedures commonly employed fail to provide etchants capable of distinguishing the various films. One of the more popular techniques employed for overcoming this drawback has involved the use of mechanical masking. Unfortunately, mechanical masking suffers from the inherent defect of imposing limitations on pattern definition and is found to be economically prohibitive. Although other procedures for effecting this end are known, they too suffer from certain inherent deficiencies.

Recently, a procedure for obviating the aforementioned difficulties was described wherein an anodic tantalum oxide film initially formed on either resistors or capacitors serves as an etch stop when removing subsequently deposited tantalum components from the areas in which deposition was initially effected. Although this technique has proven satisfactory in most applications, workers in the art have sought to develop alternate methods designed to effect a reduction in mask levels and the number of etching steps, thereby resulting in enhanced yield and a significant reduction in processing costs.

SUMMARY OF THE INVENTION

In accordance with the present invention, these ends are attained by a novel processing sequence wherein a beta-tantalum capacitor film is initially deposited over a tantalum nitride resistor film and converted to the corresponding oxide which serves as a protective oxide for the resistor and is not removed during the etching steps. Pursuant to this procedure, resistors and capacitors are delinated in one mask level, capacitors anodized and a suitable conductor material evaporated and patterned. During the final step involving trim anodization, the capacitor film overlying the resistors is converted to tantalum pentoxide, thereby providing a protective encapsulant.

BRIEF DESCRIPTION OF THE DRAWING

The invention will be more readily understood from the following detailed description taken in conjunction with the accompanying drawing wherein.

DETAILED DESCRIPTION

Initially, a suitable substrate member is selected. In order to obtain the best quality of metal deposition, it is preferred that the substrate be smooth and completely free from sharp changes in contour. Materials found suitable for this purpose include glasses, glazed ceramics, high-melting glazed metals and the like. These materials also meet the requirements of heat resistance and nonconductivity essential for substrates utilized in reactive sputtering techniques.

The substrate chosen is first vigorously cleaned in order to rid the surface thereof of contaminants. Conventional cleansing techniques may suitably be employed to effect this end, the choice of a particular procedure being dependent upon the composition of the substrate itself. For example, where the substrate consists of glass or a glazed ceramic, ultrasonic cleansing followed by boiling in hydrogen peroxide is a convenient method for cleaning the surface.

Following the cleaning procedure, it may be desirable to deposit a thin layer of a film-forming metal upon the substrate by conventional cathodic sputtering or vacuum evaporation techniques and then to thermally oxidize the resultant deposited film in accordance with the procedure described in U.S. Pat. 3,220,938, issued on Nov. 30, 1965. The resultant oxide film serves the purpose of protecting the substrate from attack by corrosive etchants during the course of the subsequent processing. However, it will be understood by those skilled in the art that if the substrate selected is capable of withstanding contact with etchants used in the subsequent processing, there is no need for its presence.

The next step in the practice of the present invention involves deposition of the resistor film which comprises tantalum nitride. This end is conveniently attained by reactively sputtering tantalum in a nitrogen containing ambient at voltages ranging from three to seven kilovolts at nitrogen partial pressures ranging from $10^{-6}$ to $10^{-3}$ torr. For purposes of this invention, the minimum thickness of the layer so deposited is approximately 500 A. There is no maximum limit on this thickness although little advantage is gained by an increase beyond 2000 A.

Figure 1A:
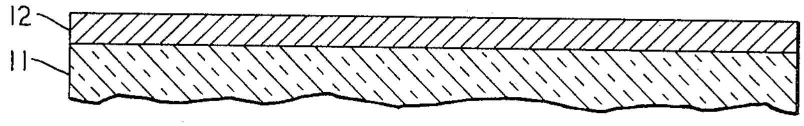
FIGS. 1A through 1G are cross-sectional views in successive stages of manufacture of a thin film tantalum RC circuit fabricated in accordance with the present invention.

With reference now to FIG. 1A, there is shown in cross-sectional view a substrate 11 having a layer of tantalum nitride 12 deposited thereon as described above.

Figure 1B:
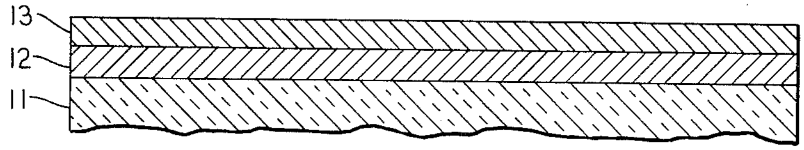

The next step in the inventive process involves the deposition of a beta-tantalum capacitor film 13 by cathodic sputtering techniques at voltages ranging from 4000 to 6000 volts and current densities ranging from 0.5 to 5 milliamperes per square inch in an argon ambient comprising from 20 to 30 microns of argon. The thickness of the beta-tantalum layer may suitably range from 1000 to 3000 A., such limits being dictated by practical considerations, for example, the anodization voltage and the base resistance of the capacitor electrode. For the purposes of the invention, the minimum thickness of the beta-tantalum layer is dependent upon two factors. The first of these is the thickness of metal which is to be converted into the oxide form during the subsequent anodizing step. The second factor is the minimum thickness of unoxidized metal remaining after anodization commensurate with the maximum resistance which can be tolerated in the beta-tantalum electrode. It has been determined that the preferred minimum thickness of the beta-tantalum is approximately 1000 A. as noted above. The maximum limit on this thickness is about 3000 A. The resultant structure including beta-tantalum layer 13 is shown in FIG. 1B.

Figure 1C:
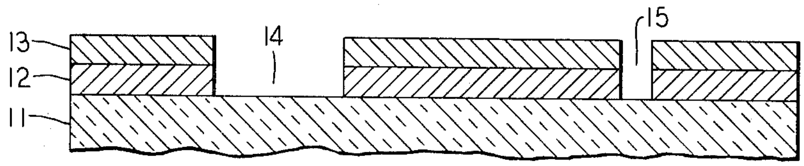

The next step in the inventive process involves photoengraving a pattern in layers 12 and 13 so as to completely remove certain portions thereof to yield a resistor meander and a capacitor slit. Any one of the well-known conventional procedures may be used to effect this end, the etchant selected typically including hydrofluoric acid. FIG. 1C is a cross-sectional view of the resultant assembly showing resistor meander 14 and capacitor slit 15, the numerals representing the areas from which beta-tantalum and tantalum nitride were removed during the photoengraving process.

Next, the assembly is heated in the presence of air at a temperature within the range of 250 and 400° C. for a time period ranging from one to five hours, thereby stabilizing the nitride film.

Figure 1D:
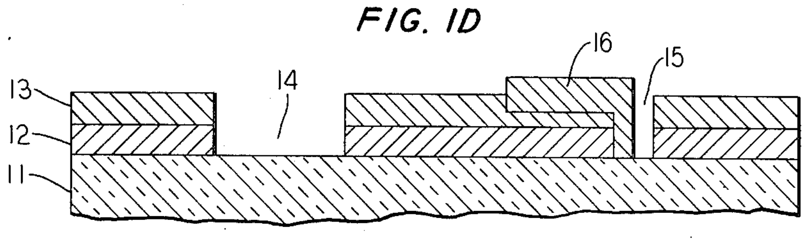

Following, the resultant assembly is anodized for the purpose of forming an anodic oxide film which will serve as the dielectric of the capacitors. Prior to anodization it is necessary to mask those areas not required to be anodized. This is conveniently accomplished by means of a suitable photoresist, masking grease and so forth. The anodization step itself may be any conventional procedure commonly employed for the purpose such as electrolytic anodization and the like. Examples of preferred electrolytes are aqueous solutions of oxalic acid, citric acid, tartaric acid and so forth. FIG. 1D is a cross-sectional view of the structure of FIG. 1C after anodization of a portion of beta-tantalum layer 13 to tantalum pentoxide 16. Subsequent to anodization, the mask is removed by conventional cleaning techniques in order to remove contaminants and mask residues.

Figure 1E:
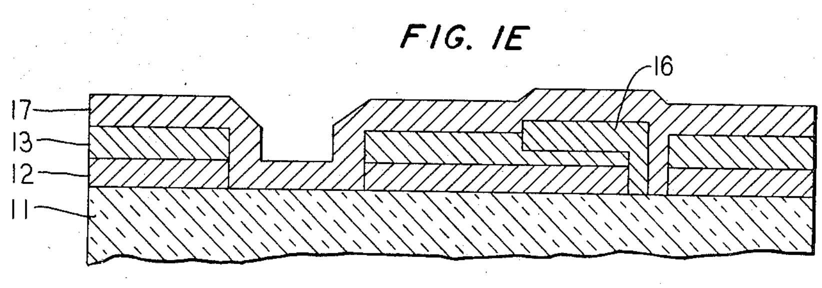

Next, a conductor contact film is deposited over the entirety of the structure shown in FIG. 1D. The contact film 17 shown in FIG. 1E provides a base conductor in the circuit for interconnections and may be a Nichrome-gold film. Once again, the thickness of this film is not critical, the minima and maxima being dictated by practical considerations. An exemplary procedure involves deposition of a thin film of Nichrome of a thickness within the range of 100 to 500 A. followed by the deposition of a gold film ranging in thickness from 1000 to 10,000 A.

Figure 1F:
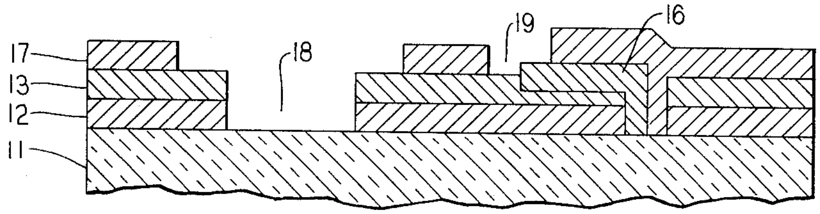

Then, conductor contact film 17 is etched off the resistor area and serves as the counterelectrode of the capacitor and completes the connection between the capacitor and the circuit. The resultant structure is shown in FIG. 1F, numerals 18 and 19 representing the areas from which the conductor contact film 17 was removed. This etching step is effected by a repetitive etching process which involves masking the contact film in those areas in which its retention is desired and immersing the assembly in a potassium iodide-iodine solution and then a potassum iodide-water solution for the purpose of removing the gold. Following, the titanium portion of the contact film is removed with a suitable etchant typically comprising dilute hydrofluoric acid, nitric acid and water. Nichrome may suitably be removed with hydrochloric acid.

Figure 1G:
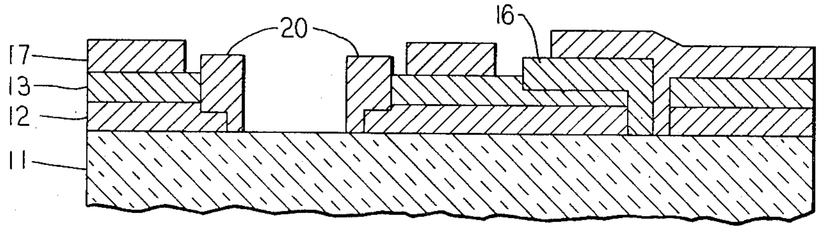

At this point, the resistor track is anodized, the other portion of the circuit being masked with a suitable grease or photoresist. Anodization may be effected in the manner set forth above to yield an anodized layer comprising tantalum oxide 20 (converted beta-tantalum and tantalum nitride) shown in FIG. 1G. This anodization results in trimming of the resistor track to the desired value.

An example of the present invention is described in detail below. This example and the foregoing illustration is included merely to aid in the understanding of the invention and variations may be made by one skilled in the art without departing from the spirit and scope of the invention.

EXAMPLE

A glass microscope slide approximately one and one-half inches in width and three inches in length having deposited thereon a layer of tantalum pentoxide approximately 1500 A. in thickness was selected as the substrate. The substrate was cleaned ultrasonically with a detergent and rinsed in overflowing tap water. Thereafter it was placed in boiling hydrogen peroxide and then rinsed in distilled water, followed by a further rinse in overflowing distilled deionized water. The substrate was then blown dry in nitrogen and fired in an oven at 550° C. for thirty minutes.

Next, the assembly was placed in a sputtering apparatus and the chamber evacuated to a pressure of $5 \times 10^{-7}$ torr. After attaining such pressure, nitrogen was admitted into the chamber at a partial pressure of approximately $6 \times 10^{-4}$ torr and after obtaining equilibrium, argon was admitted at a pressure of approximately 12 microns of mercury. Sputtering was effected by impressing 6600 volts D–C between cathode and anode at a current of approximately 250 milliamperes. Sputtering was conducted for a time period sufficient to yield a tantalum nitride film 1000 A. in thickness.

After deposition of the tantalum nitride layer, the assembly was moved to a second sputtering chamber and the chamber evacuated to a pressure of approximately $1 \times 10^{-6}$ torr and argon admitted at a pressure of approximately 20 microns of mercury. A direct current voltage of 4000 volts was then impressed between the cathode and anode at a current density of approximately three milliamperes per square inch. Sputtering was conducted for approximately 45 minutes, so resulting in the formation of a 5000 A. thick layer of beta-tantalum.

Following, a photosensitive etch resist was applied to the beta-tantalum and processing effected in accordance with conventional photoengraving techniques for the purpose of etching a resistor window and capacitor slit, the etchant being a 5:1:1 solution of hydrofluoric acid, nitric acid and water. Then, the assembly was heated in air at 250° C. for approximately five hours for the purpose of stabilizing the tantalum nitride. At that juncture, anodization of the assembly was effected in a 0.01 percent citric acid-water solution with a current density of approximately one milliampere per square centimeter to approximately 100 percent of the final desired anodization voltage, those areas not destined for anodization having been suitably masked. After anodization, the assembly was placed in a vacuum evaporation apparatus and 500 A. of Nichrome deposited thereon followed by 5000 A. of gold. Next, the resultant Nichrome-gold film was etched off the resistor track and capacitor pattern by masking those areas which it was desired to retain by means of a suitable grease and immersing the structure in a potassium iodide-iodine solution followed by a rinse in a potassium iodide-water solution and the cycle repeated until the gold was removed as observed visually. The Nichrome was removed by etching.

I claim:

1. A process for the fabrication of a thin film discrete RC network which comprises the steps of (a) depositing a layer of tantalum nitride on a substrate member by cathodic sputtering of tantalum in the presence of nitrogen, (b) depositing a layer of beta-tantalum over said tantalum nitride layer by cathodic sputtering of tantalum, (c) delineating resistor and capacitor areas thereon, (d)

stabilizing said resistors by heating in air at temperatures ranging from 250 to 400° C., (e) anodizing said capacitor areas, (f) depositing a contact electrode over the entirety of the resultant assembly, (g) generating a conductor and capacitor pattern in said assembly, and (h) trim anodizing said resistors to value.

References Cited

UNITED STATES PATENTS

| | | | |
|---|---|---|---|
| 3,489,656 | 1/1970 | Balde | 317—234.5 |
| 3,607,679 | 9/1971 | Melroy et al. | 204—192 |
| 3,242,006 | 3/1966 | Gerstenberg | 204—192 |
| 3,382,053 | 5/1968 | Altman | 29—194 |

JOHN H. MACK, Primary Examiner

S. S. KANTER, Assistant Examiner

U.S. Cl. X.R.

117—93, 107, 217; 317—234/8